(12) United States Patent
Goh (10) Patent No.: US 7,864,141 B2
(45) Date of Patent: Jan. 4, 2011

(54) DISPLAY DEVICE AND A DRIVING METHOD THEREOF

(75) Inventor: Joon-Chul Goh, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 998 days.

(21) Appl. No.: 11/157,583

(22) Filed: Jun. 21, 2005

(65) Prior Publication Data
US 2005/0280614 A1    Dec. 22, 2005

(30) Foreign Application Priority Data

Jun. 22, 2004  (KR)  .................. 10-2004-0046492

(51) Int. Cl.
*G09G 3/30* (2006.01)
(52) U.S. Cl. .............. 345/82; 345/76; 345/46; 345/83; 345/77; 345/39; 315/169.1; 315/169.3; 315/169.4; 313/504
(58) Field of Classification Search .......... 345/76, 345/204, 82, 46, 83; 315/169.1, 169.3; 313/504
See application file for complete search history.

(56) References Cited

U.S. PATENT DOCUMENTS

| | | | |
|---|---|---|---|
| 6,348,906 B1* | 2/2002 | Dawson et al. | 345/82 |
| 6,847,340 B2* | 1/2005 | Wang et al. | 345/76 |
| 6,858,992 B2* | 2/2005 | Park et al. | 315/169.3 |
| 6,876,345 B2* | 4/2005 | Akimoto et al. | 345/76 |
| 6,937,215 B2* | 8/2005 | Lo | 345/82 |
| 7,053,890 B2* | 5/2006 | Inukai | 345/211 |
| 7,619,593 B2* | 11/2009 | Fish et al. | 345/76 |
| 7,710,366 B2* | 5/2010 | Lee et al. | 345/82 |
| 2003/0227262 A1* | 12/2003 | Kwon | 315/169.3 |
| 2004/0004443 A1 | 1/2004 | Park et al. | |
| 2004/0056828 A1* | 3/2004 | Choi et al. | 345/82 |

FOREIGN PATENT DOCUMENTS

| | | |
|---|---|---|
| CN | 1540614 | 10/2004 |
| CN | 1542718 | 11/2004 |
| EP | 1130565 | 9/2001 |
| JP | 2003-108067 | 4/2003 |
| JP | 2003-108086 | * 4/2003 |
| WO | 03077230 | 9/2003 |

\* cited by examiner

*Primary Examiner*—Sumati Lefkowitz
*Assistant Examiner*—Grant D Sitta
(74) *Attorney, Agent, or Firm*—F. Chau & Associates, LLC (57) ABSTRACT

A display device and a driving method thereof are provided. The display device comprises a plurality of pixels, each pixel includes: a light emitting element; a storage capacitor; a driving transistor that has a control terminal, an input terminal, and an output terminal and supplies a current to the light emitting element to emit light; a first switching transistor for supplying a data voltage to the storage capacitor in response to a scanning signal; a second switching transistor for diode-connecting the driving transistor in response to a previous scanning signal; and a third switching transistor for supplying a driving voltage to the driving transistor in response to an emission signal, wherein the storage capacitor stores a control voltage depending on a threshold voltage of the driving transistor and a threshold voltage of the light emitting element through the diode-connected driving transistor, and transmits the control voltage and the data voltage to the control terminal of the driving transistor.

18 Claims, 8 Drawing Sheets

DISPLAY DEVICE AND A DRIVING METHOD THEREOF

TECHNICAL FIELD

The present invention relates to a display device and a driving method thereof, and in particular, to a light emitting display device and a driving method thereof.

DESCRIPTION OF THE RELATED ART

Recently, personal computers and televisions that are light-weight and thin have been developed. These personal computers and televisions typically use light-weight and thin display devices such as flat panel displays in place of conventional cathode ray tube (CRT) displays. Flat panel displays may include, for example, liquid crystal displays (LCDs), field emission displays (FEDs), organic light emitting displays (OLEDs), plasma display panels (PDPs), and so on.

Generally, an active matrix flat panel display includes a plurality of pixels arranged in a matrix and displays images by controlling the luminance of the pixels based on given luminance information. An OLED is a self-emissive display device that displays images by electrically exciting light emitting organic material. The OLED has low power consumption, a wide viewing angle, and a fast response time, thereby finding increasing use for displaying moving images.

A pixel of an OLED includes a light emitting element and a driving thin film transistor (TFT). The light emitting element emits light having an intensity that depends on the current driven by the driving TFT, which in turn depends on the threshold voltage of the driving TFT and the voltage between a gate and source of the driving TFT.

The driving TFT may be polysilicon or amorphous silicon. A polysilicon TFT has several advantages; however, it also has certain disadvantages such as a complex of manufacturing process that increases its manufacturing cost. In addition, it is difficult to make a large OLED employing polysilicon TFTs.

On the contrary, an amorphous silicon TFT is suited for use with large OLEDs and its manufacturing process is less complex than that of the polysilicon TFT. However, the threshold voltage of the amorphous silicon TFT shifts over time as a DC control voltage, which varies luminance for a given data voltage, is applied thereto.

In addition, when the light emitting element is driven for a long time the threshold voltage of the light emitting element is shifted. For an OLED employing an n-type driving TFT, because the light emitting element is connected to the source of the driving TFT the shift of the threshold voltage of the light emitting element changes the voltage at the source of the driving TFT to vary the current driven by the driving TFT. Accordingly, the image quality of the OLED may be degraded.

SUMMARY OF THE INVENTION

According to an exemplary embodiment of the present invention, a display device including a plurality of pixels is provided. Each pixel includes: a light emitting element; a storage capacitor; a driving transistor that has a control terminal, an input terminal, and an output terminal and supplies a current to the light emitting element to emit light; a first switching transistor for supplying a data voltage to the storage capacitor in response to a scanning signal; a second switching transistor for diode-connecting the driving transistor in response to a previous scanning signal; and a third switching transistor for supplying a driving voltage to the driving transistor in response to an emission signal, wherein the storage capacitor stores a control voltage depending on a threshold voltage of the driving transistor and a threshold voltage of the light emitting element through the diode-connected driving transistor, and transmits the control voltage and the data voltage to the control terminal of the driving transistor.

The second switching transistor may connect the control terminal and the input terminal of the driving transistor in response to the previous scanning signal. The first switching transistor may connect the storage capacitor to the data voltage in response to the scanning signal, and the third switching transistor may connect the input terminal of the driving transistor to the driving voltage in response to the emission signal.

The display device may further include a fourth switching transistor for connecting the storage capacitor to a reference voltage in response to the previous scanning signal. The plurality of pixels may include first and second pixels supplied with different values of the reference voltage.

The display device may further include an auxiliary capacitor connected to the storage capacitor for storing a voltage. The display device may further include: a scanning driver for generating the previous scanning signal and the scanning signal; a data driver for generating the data voltage; and an emission driver for generating the emission signal.

The first switching transistor may connect the storage capacitor to a reference voltage in response to the scanning signal. The display device may further include: a scanning driver for generating the previous scanning signal and the scanning signal; a data driver for generating the data voltage and the reference voltage; and an emission driver for generating the emission signal.

The plurality of pixels may include first and second pixels and the reference voltage may have different values to be supplied to the first and the second pixels. The display device may further include a signal controller for controlling the scanning driver, the data driver, and the emission driver.

The first to third switching transistors and the driving transistor may include amorphous silicon. The first to third switching transistors and the driving transistor may include n-channel thin film transistors. The light emitting element may include an organic light emitting layer.

According to another exemplary embodiment of the present invention, a display device is provided, which includes: a light emitting element; a driving transistor having an input terminal connected to a driving voltage, an output terminal connected to the light emitting element, and a control terminal; a first switching transistor that operates in response to a scanning signal and is connected between the control terminal of the driving transistor and a data voltage; a second switching transistor that operates in response to a previous scanning signal and is connected between the input terminal and the control terminal of the driving transistor; a third switching transistor that operates in response to an emission signal and is connected between the input terminal of the driving transistor and the driving voltage; and a storage capacitor connected between the control terminal of the driving transistor and the first switching transistor.

The display device may further include a fourth switching transistor for operating in response to the previous scanning signal and is connected between the storage capacitor and a reference voltage. The display device may further include an auxiliary capacitor connected between the storage capacitor and the driving voltage or the reference voltage.

According to yet another exemplary embodiment of the present invention, a method of driving a display device including a driving transistor having a control terminal and first and second terminals, a light emitting element connected to the second terminal of the driving transistor, and a capacitor connected to the control terminal of the driving transistor is provided, which includes: supplying a reference voltage and a driving voltage to respective terminals of the capacitor; connecting the control terminal and the first terminal of the driving transistor; applying a data voltage to the capacitor; and connecting the first terminal of the driving transistor to the driving voltage.

The connection of the control terminal and the first terminal of the driving transistor may block the driving voltage. The application of the data voltage may isolate the first terminal of the driving transistor.

BRIEF DESCRIPTION OF THE DRAWINGS

The present invention will become more apparent by describing exemplary embodiments thereof in detail with reference to the accompanying drawings in which.

DETAILED DESCRIPTION OF EXEMPLARY EMBODIMENTS

The present invention will be described more fully hereinafter with reference to the accompanying drawings, in which exemplary embodiments of the invention are shown. In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Referring to FIGS. 1-6D, an organic light emitting display (OLED) according to an exemplary embodiment of the present invention will be described in detail.

Figure 1:
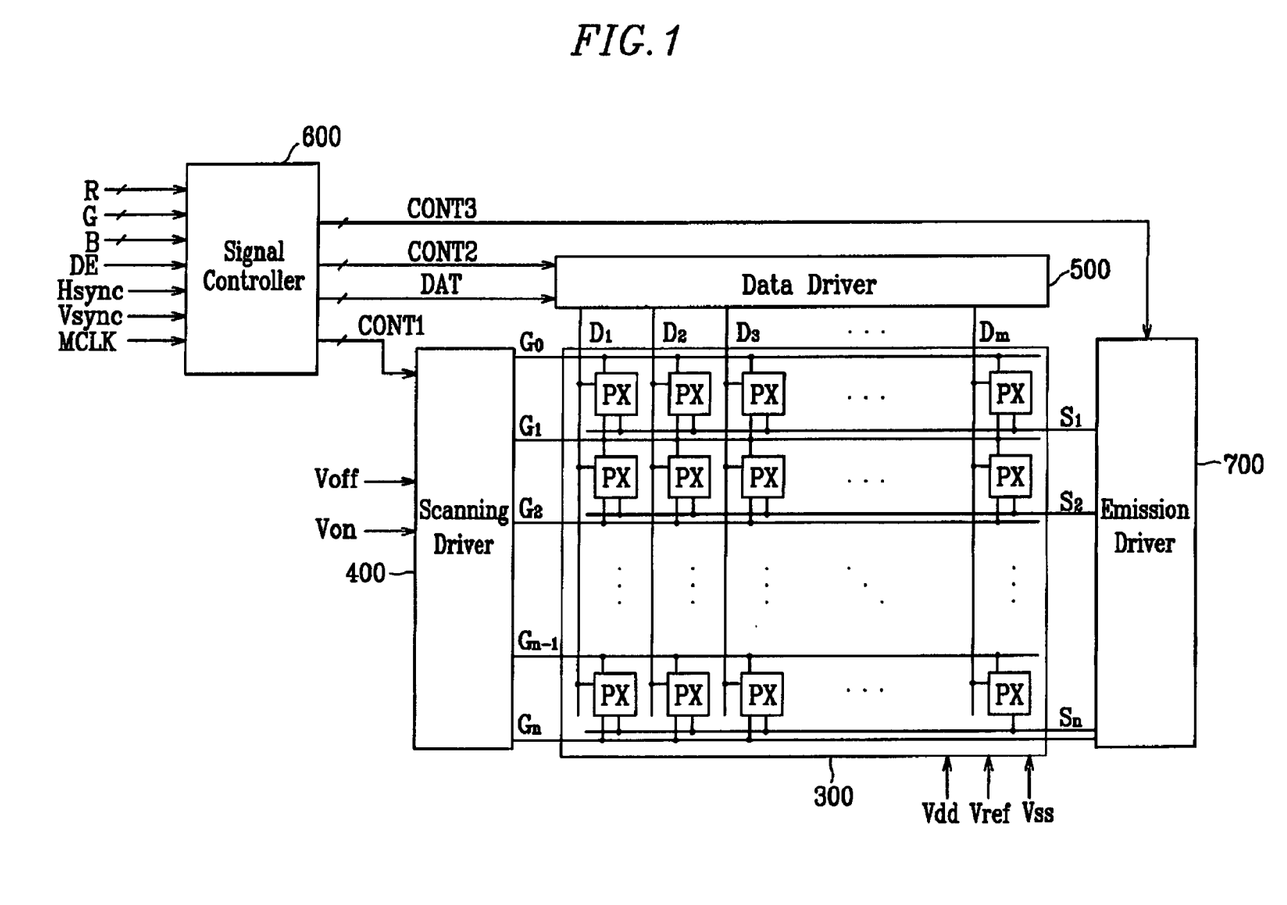
FIG. 1 is a block diagram of an organic light emitting display (OLED) according to an exemplary embodiment of the present invention.
Figure 2:
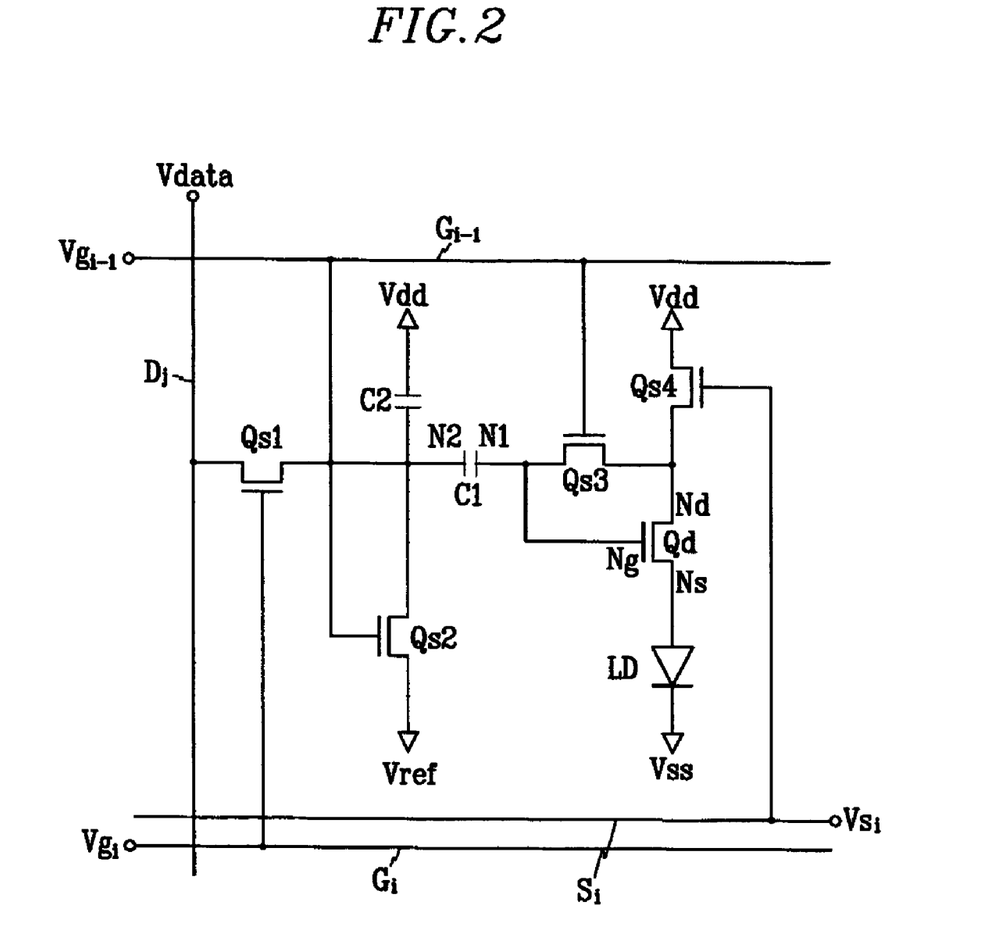
FIG. 2 is an equivalent circuit diagram of a pixel of an OLED according to an exemplary embodiment of the present invention.

FIG. 1 is a block diagram of an OLED according to an exemplary embodiment of the present invention and FIG. 2 is an equivalent circuit diagram of a pixel of an OLED according to an exemplary embodiment of the present invention.

Referring to FIG. 1, the OLED includes a display panel 300, a scanning driver 400, a data driver 500, and an emission driver 700 all connected to the display panel 300, and a signal controller 600 for controlling the display panel 300, scanning driver 400, data driver 500 and emission driver 700.

Referring to FIG. 1, the display panel 300 includes a plurality of signal lines, a plurality voltage lines (not shown), and a plurality of pixels PX connected thereto and arranged substantially in a matrix.

The signal lines include a plurality of scanning lines $G_0$-$G_n$ for transmitting scanning signals, a plurality of data lines $D_1$-$D_m$ for transmitting data signals, and a plurality of emission lines $S_1$-$S_n$ for transmitting emission signals. The scanning lines $G_0$-$G_n$ and the emission lines $S_1$-$S_n$ extend substantially in a row direction and are substantially parallel to each other, while the data lines $D_1$-$D_m$ extend substantially in a column direction and are substantially parallel to each other.

Referring to FIG. 2, the voltage lines include driving voltage lines (not shown) for transmitting a driving voltage Vdd and reference voltage lines (not shown) for transmitting a reference voltage Vref.

Each pixel PX, for example, a pixel connected to a scanning line $G_i$ and a data line $D_j$ includes an organic light emitting element LD, a driving transistor Qd, a pair of capacitors C1 and C2, and four switching transistors Qs1-Qs4.

The driving transistor Qd has a control terminal Ng, an input terminal Nd, and an output terminal Ns and the input terminal Nd of the driving transistor Qd is connected to a driving voltage Vdd.

The capacitor C1 has a terminal N1 connected to the control terminal Ng of the driving transistor Qd and another terminal N2 connected to the switching transistors Qs1 and Qs2. The capacitor C2 is connected between the capacitor C1 and the driving voltage Vdd.

The light emitting element LD has an anode connected to the output terminal Ns of the driving transistor Qd and a cathode connected to a common voltage Vss. The light emitting element LD emits light having an intensity that depends on an output current $I_{LD}$ of the driving transistor Qd. The output current $I_{LD}$ of the driving transistor Qd depends on a voltage Vgs between the control terminal Ng and the output terminal Ns.

The switching transistor Qs1 is connected to the scanning line $G_i$, a data voltage Vdata, and the terminal N2 of the capacitor C1 and operates in response to a scanning signal $Vg_i$, the switching transistor Qs2 is connected to a previous scanning line $G_{i-1}$, the reference voltage Vref, and the terminal N2 of the capacitor C1 and the switching transistor Qs3 is connected to a previous scanning line $G_{i-1}$, the control terminal Ng and the input terminal Nd of the driving transistor Qd. The switching transistors Qs2 and Qs3 operate in response to a scanning signal $Vg_{i-1}$ applied to the previous scanning line $G_{i-1}$.

The switching transistor Qs4 is connected between the input terminal Nd of the driving transistor Qd and the driving voltage Vdd and operates in response to an emission signal $Vs_i$.

The switching transistors Qs1-Qs4 and the driving transistor Qd are n-channel field effect transistors (FETs) including amorphous silicon or polysilicon. However, the transistors Qs1-Qs4 and Qd may be p-channel FETs operating in a manner opposite n-channel FETs.

The light emitting element LD and the driving transistor Qd connected thereto as shown in FIG. 2 will be described in detail with reference to FIGS. 3 and 4.

Figure 3:
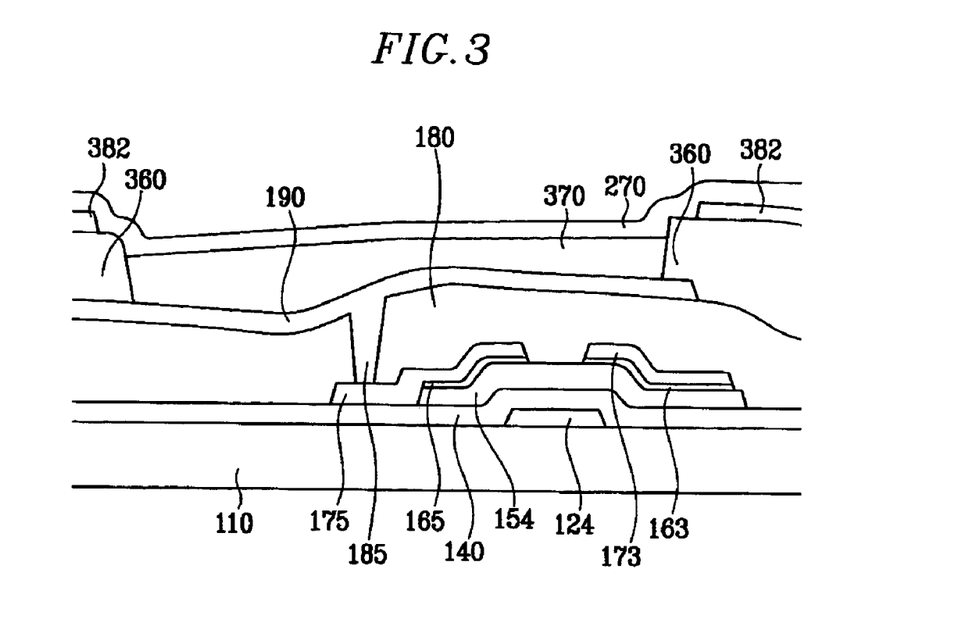
FIG. 3 is an exemplary sectional view of a light emitting element and a driving element shown in FIG. 2.
Figure 4:
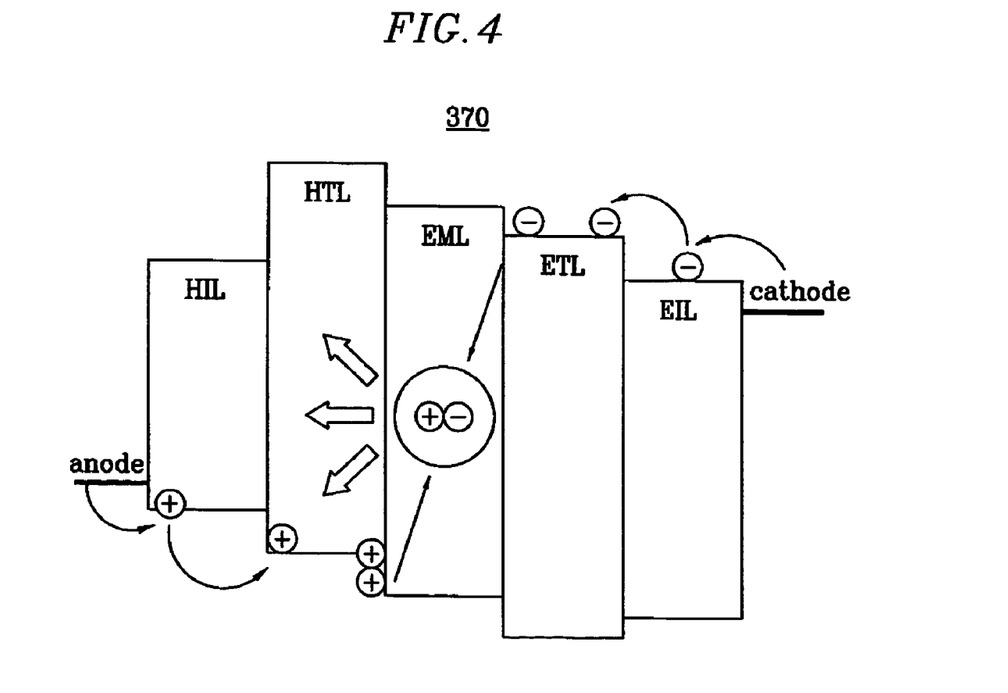
FIG. 4 is a schematic diagram of an organic light emitting element according to an exemplary embodiment of the present invention.

FIG. 3 is an exemplary sectional view of the light emitting element LD and the driving transistor Qd as shown in FIG. 2 and FIG. 4 is a schematic diagram of an organic light emitting element according to an exemplary embodiment of the present invention.

A control or gate electrode 124 is formed on an insulating substrate 110. The control electrode 124 is preferably made of an Al containing metal such as Al and Al alloy, an Ag containing metal such as Ag and Ag alloy, a Cu containing metal such as Cu and Cu alloy, an Mo containing metal such as Mo and Mo alloy, Cr, Ti or Ta. The control electrode 124 may have a multi-layered structure including two films having different physical characteristics. One of the two films is preferably made of a low resistivity metal including an Al containing metal, an Ag containing metal, and a Cu containing metal for reducing signal delay or voltage drop. The other film is preferably made of a material such as an Mo containing metal, Cr, Ta or Ti, which has good physical, chemical, and electrical contact characteristics with other materials such as indium tin oxide (ITO) or indium zinc oxide (IZO).

Additional examples of the combination of the two films are a lower Cr film and an upper Al (alloy) film and a lower Al (alloy) film and an upper Mo (alloy) film. However, the gate electrode 124 may be made of various metals or conductors. The lateral sides of the gate electrode 124 are inclined relative to a surface of the substrate 110, and the inclination angle thereof ranges about 30-80 degrees. An insulating layer 140 preferably made of silicon nitride (SiNx) is formed on the control electrode 124.

A semiconductor 154 preferably made of hydrogenated amorphous silicon (a-Si) or polysilicon is formed on the insulating layer 140, and a pair of ohmic contacts 163 and 165 preferably made of silicide or an n+ hydrogenated a-Si heavily doped with an n type impurity such as phosphorous are formed on the semiconductor 154. The lateral sides of the semiconductor 154 and the ohmic contacts 163 and 165 are inclined relative to the surface of the substrate 110, and the inclination angles thereof are preferably in a range of about 30-80 degrees.

An input electrode 173 and an output electrode 175 are formed on the ohmic contacts 163 and 165 and the insulating layer 140. The input electrode 173 and the output electrode 175 are preferably made of a refractory metal such as Cr, Mo, Ti, Ta or alloys thereof. However, the input electrode 173 and the output electrode 175 may have a multilayered structure including a refractory metal film (not shown) and a low resistivity film (not shown). An example of the multi-layered structure is a double-layered structure including a lower Cr/Mo (alloy) film and an upper Al (alloy) film and a triple-layered structure of a lower Mo (alloy) film, an intermediate Al (alloy) film, and an upper Mo (alloy) film. Like the gate electrode 124, the input electrode 173 and the output electrode 175 have inclined edge profiles, and the inclination angles thereof range about 30-80 degrees.

The input electrode 173 and the output electrode 175 are separated from each other and disposed opposite each other with respect to the gate electrode 124. The control electrode 124, the input electrode 173, and the output electrode 175 as well as the semiconductor 154 form a TFT serving as a driving transistor Qd having a channel located between the input electrode 173 and the output electrode 175.

The ohmic contacts 163 and 165 are interposed only between underlying stripes of the semiconductor 154 and the overlying input electrode 173 and the output electrode 175 thereon, thus reducing the contact resistance therebetween. The semiconductor 154 includes an exposed portion, which is not covered by the input electrode 173 and the output electrode 175.

A passivation layer 180 is formed on the input electrode 173 and the output electrode 175, the exposed portion of the semiconductor 154, and the insulating layer 140. The passivation layer 180 is preferably made of an inorganic insulator such as silicon nitride or silicon oxide, or a low dielectric insulating material. The low dielectric material preferably has a dielectric constant lower than 4.0. Examples of the low dielectric material are a-Si:C:O and a-Si:O:F formed by plasma enhanced chemical vapor deposition (PECVD). The organic insulator may have a photosensitivity and the passivation layer 180 may have a flat surface. The passivation layer 180 may have a double-layered structure including a lower inorganic film and an upper organic film so that it may take advantage of the organic film as well as protect the exposed portion of the semiconductor 154. The passivation layer 180 has a contact hole 185 for exposing a portion of the output electrode 175.

A pixel electrode 190 is formed on the passivation layer 180. The pixel electrode 190 is physically and electrically connected to the output electrode 175 through the contact hole 185 and is preferably made of a transparent conductor such as ITO or IZO or a reflective metal such as Ag or Al.

A partition 360 is formed on the passivation layer 180. The partition 360 encloses a periphery of the pixel electrode 190 to define an opening on the pixel electrode 190 such as a bank and is preferably made of an organic or inorganic insulating material.

An organic light emitting member 370 is formed on the pixel electrode 190 and is confined in the opening enclosed by the partition 360.

Referring to FIG. 4, the organic light emitting member 370 has a multilayered structure including an emitting layer EML and auxiliary layers for improving the efficiency of light emission of the emitting layer EML. The auxiliary layers include an electron transport layer ETL and a hole transport layer HTL for improving the balance of the electrons and holes and an electron injecting layer EIL and a hole injecting layer HIL for improving the injection of the electrons and holes. The auxiliary layers may be omitted from the organic light emitting member 370.

An auxiliary electrode 382 having a low resistivity such as Al (alloy) is formed on the partition 360.

A common electrode 270 supplied with a common voltage Vss is formed on the organic light emitting member 370 and the partition 360. The common electrode 270 is preferably made of a reflective metal such as Ca, Ba, Al or Ag, or a transparent conductive material such as ITO or IZO.

The auxiliary electrode 382 contacts the common electrode 270 to compensate for the conductivity of the common electrode 270 to prevent the voltage of the common electrode 270 from distorting.

A combination of opaque pixel electrodes 190 and a transparent common electrode 270 is employed by a top emission OLED that emits light toward the top of the display panel 300, and a combination of transparent pixel electrodes 190 and an opaque common electrode 270 is employed by a bottom emission OLED that emits light toward the bottom of the display panel 300.

A pixel electrode 190, an organic light emitting member 370, and a common electrode 270 form the light emitting element LD having the pixel electrode 190 as an anode and the common electrode 270 as a cathode or vice versa. The light emitting element LD emits one of the primary color lights depending on the material of the light emitting member 370. An exemplary set of the primary colors includes red, green, and blue and the display of images is realized by the addition of the three primary colors.

Referring to FIG. 1 again, the scanning driver 400 is connected to the scanning lines $G_0$-$G_n$ of the display panel 300 and synthesizes a high level voltage Von for turning on the switching transistors Qs1-Qs3 and a low level voltage Voff for turning off the switching transistors Qs1-Qs3 to generate scanning signals for application to the scanning lines $G_0$-$G_n$.

The data driver 500 is connected to the data lines $D_1$-$D_m$ of the display panel 300 and applies data signals Vdata to the data lines $D_1$-$D_m$.

The emission driver 700 is connected to the emission lines $S_1$-$S_n$ of the display panel 300 and synthesizes a high level voltage Von for turning on the switching transistor Qs4 and a low level voltage Voff for turning off the switching transistor Qs4 to generate emission signals for application to the emission lines $S_1$-$S_n$.

The scanning driver 400, the data driver 500, or the emission driver 700 may be implemented as an integrated circuit (IC) chip mounted on the display panel 300 or on a flexible printed circuit (FPC) film in a tape carrier package (TCP), which is attached to the display panel 300. Alternately, the scanning driver 400, data driver 500, or emission driver 700 may be integrated into the display panel 300 along with the signal lines $G_0$-$G_n$, $D_1$-$D_m$, and $S_1$-$S_n$ and the transistors Qd and Qs1-Qs4.

The operation of the above-described OLED will be discussed in detail with reference to FIGS. 5 and 6A-6D.

Figure 5:
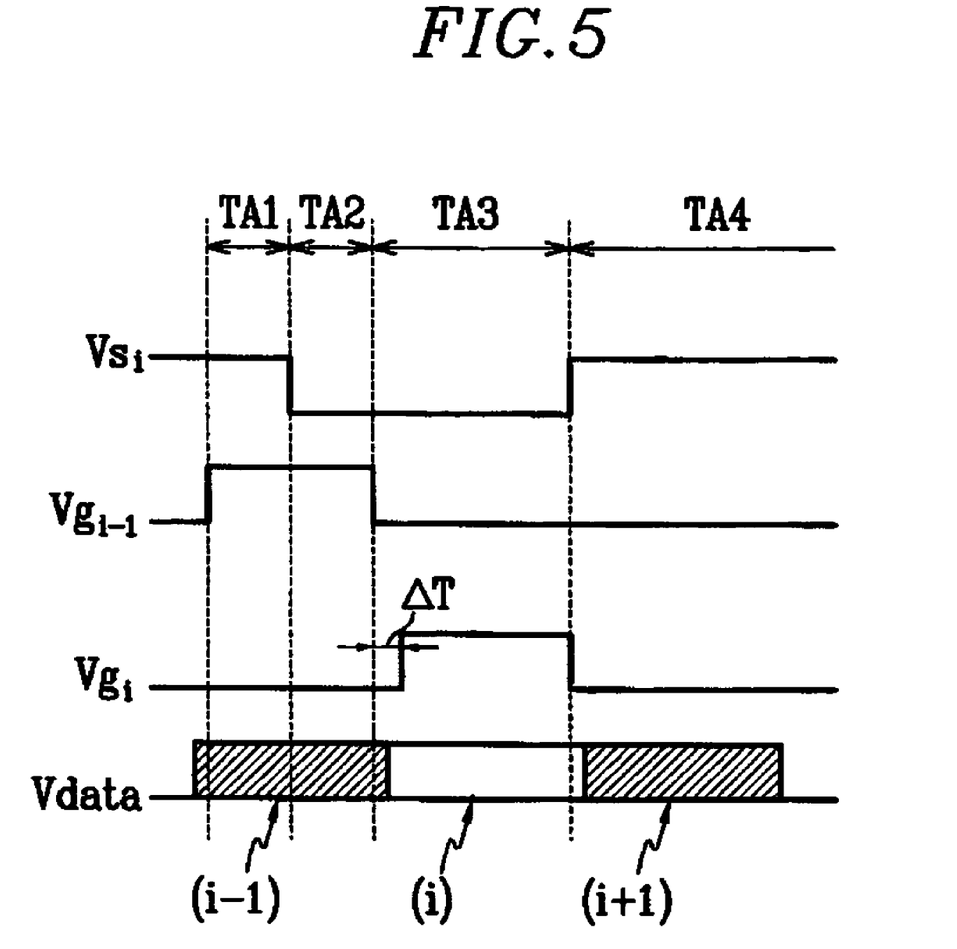
FIG. 5 is a timing chart illustrating several signals for an OLED according to an exemplary embodiment of the present invention.

FIG. 5 is a timing chart illustrating several signals for an OLED according to an exemplary embodiment of the present invention and FIGS. 6A-6D are equivalent circuit diagrams of a pixel for respective periods shown in FIG. 5.

The signal controller 600 is supplied with input image signals R, G and B and input control signals for controlling the display thereof such as a vertical synchronization signal Vsync, a horizontal synchronization signal Hsync, a main clock MCLK, and a data enable signal DE from an external graphics controller (not shown). After generating scanning control signals CONT1, data control signals CONT2, and emission control signals CONT3 and processing the image signals R, G and B suitable for operating the display panel 300 on the basis of the input control signals and the input image signals R, G and B, the signal controller 600 sends the scanning control signals CONT1 to the scanning driver 400, the processed image signals DAT and the data control signals CONT2 to the data driver 500, and the emission control signals CONT3 to the emission driver 700.

The scanning control signals CONT1 include a scanning start signal STV for instructing the scanning driver 400 to start scanning and at least one clock signal for controlling the output time of the high level voltage Von. The scanning control signals CONT1 may include a plurality of output enable signals for defining the duration of a high level voltage Von.

The data control signals CONT2 include a horizontal synchronization start signal STH for indicating the start of data transmission for a group of pixels PX, a load signal LOAD for instructing the data voltages to be applied to the data lines $D_1$-$D_m$, and a data clock signal HCLK.

A particular pixel row, for example, the i-th pixel row will be discussed.

When the data lines $D_1$-$D_m$ transmit the data voltages for the previous pixel row, e.g., the (i−1)th pixel row, the scanning driver 400 makes a scanning signal $Vg_{i-1}$ for the (i−1)-th previous scanning signal line $G_{i-1}$ equal to the high level voltage Von in response to the scanning control signals CONT1 from the signal controller 600. Then, the switching transistors Qs2 and Qs3 of the i-th pixel row connected to the previous scanning signal line $G_{i-1}$ turn on. At this time, a scanning signal $Vg_i$ transmitted by the i-th scanning line $G_i$ has a low level voltage Voff and thus the switching transistor Qs1 is in an off state.

The emission driver 700 keeps the emission signal $Vs_i$ equal to the high level voltage Von in response to the emission control signals CONT3 from the signal controller 600, thereby maintaining the switching transistor Qs4 on.

Figure 6A:
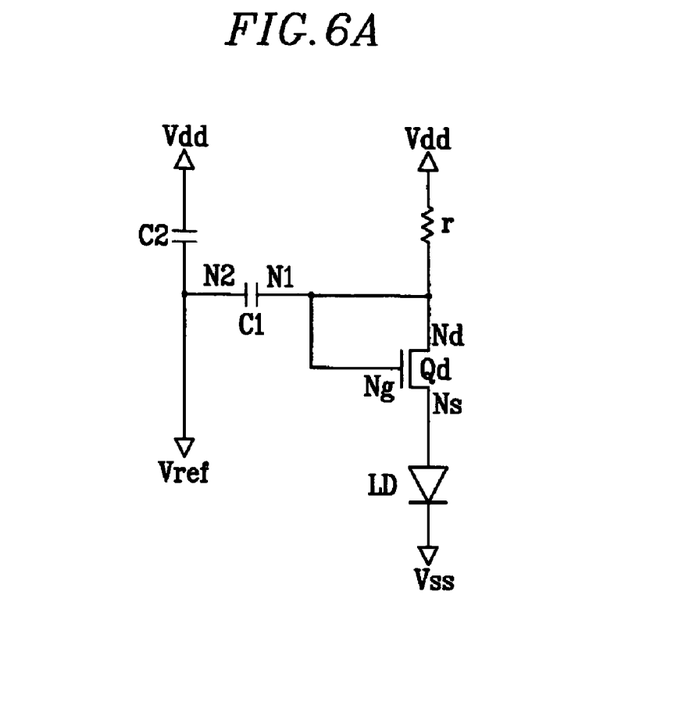
FIGS. 6A-6D are equivalent circuit diagrams of a pixel for respective periods shown in FIG. 5.

FIG. 6A shows an equivalent circuit of a pixel in this state. This period is referred to as a precharging period TA1. The switching transistor Qs4 can be represented as a resistors r shown in FIG. 6A.

Because a terminal N1 of the capacitor C1 and the control terminal Ng of the driving transistor Qd are connected to the driving voltage Vdd through the resistor r, their voltages are equal to the driving voltage Vdd subtracted by a voltage drop of the resistor r and another terminal N2 of the capacitor C1 is connected to the reference voltage Vref to be initialized with the reference voltage Vref. The voltage across the capacitor C1 is maintained by the capacitor C1. At this time, the driving voltage Vdd is higher than an output terminal voltage Vns of the driving transistor Qd to turn on the driving transistor Qd.

Then, the driving transistor Qd turns on to supply a current to the light emitting element LD, thereby emitting light from the light emitting element LD. However, the precharging period TA1 is short when compared with one frame and thus the light emission in the precharging period TA1 is negligible and does not affect a target luminance.

Next, a main charging period TA2 starts when the emission driver 700 changes the emission signal $Vs_i$ to the low level voltage Voff to turn off the switching transistor Qs4. Because the previous scanning signal $Vg_{i-1}$ maintains the high level voltage Von in this period TA2, the switching transistors Qs2 and Qs3 keep their conduction state.

Figure 6B:
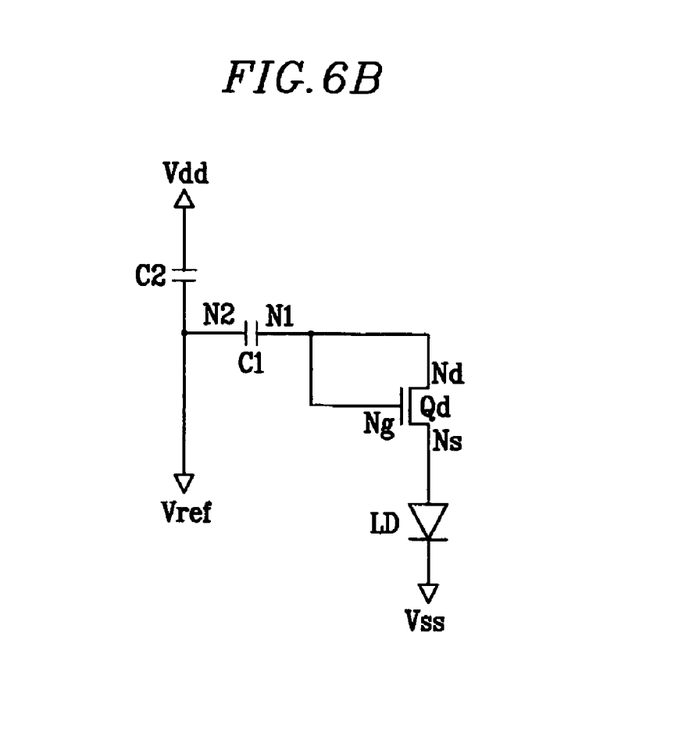

Referring to FIG. 6B, the driving transistor Qd is separated from the driving voltage Vdd and it goes into a diode connection. In detail, the control terminal Ng and the input terminal Nd of the driving transistor Qd are connected to each other and separated from the driving voltage Vdd. Because the control terminal voltage Vng of the driving transistor Qd is sufficiently high, the driving transistor Qd maintains its conduction state.

Therefore, the capacitor C1 begins to discharge its voltage that was precharged in the precharging period TA1 through the driving transistor Qd and the light emitting element LD and the control terminal voltage Vng of the driving transistor Qd become lower. The voltage drop of the control terminal voltage Vng continues until the voltage between the control terminal Ng and the output terminal Ns of the driving transistor Qd is equal to the threshold voltage Vth of the driving transistor Qd such that the driving transistor Qd supplies no current. At this time, the voltage difference between the anode and the cathode of the light emitting element LD becomes equal to a threshold voltage Vto of the light emitting element LD.

For example the control terminal voltage Vng becomes, $$Vng = Vth + Vto + Vss \quad (1)$$

Then, the voltage Vc stored in the capacitor C1 is given by:

$$Vc = Vth + Vto + Vss - Vref \quad (2)$$

Accordingly, the voltage Vc stored in the capacitor C1 depends only on the threshold voltage Vth of the driving transistor Qd and the threshold voltage Vto of the light emitting element LD.

After the voltage Vc is stored in the capacitor C1, the scanning driver 400 changes the previous scanning signal $Vg_{i-1}$ to the low level voltage Voff to turn off the switching transistors Qs2 and Qs3, which is referred to as a writing period TA3. Because the emission signal $Vs_i$ keeps the low level voltage Voff in this period TA3, the switching transistor Qs4 maintains its off state.

Next, the data driver 500 receives a packet of the image data for the i-th pixel row from the signal controller 600, converts the image data into analog data voltages Vdata, and applies the data signals Vdata to the data lines $D_1$-$D_m$ in response to the data control signals CONT2 from the signal controller 600.

The scanning driver 400 makes the scanning signal $Vg_i$ go to the high level voltage Von after a predetermined time $\Delta T$ elapses from the beginning of the writing period TA3, thereby turning on the switching transistor Qs1.

Figure 6C:
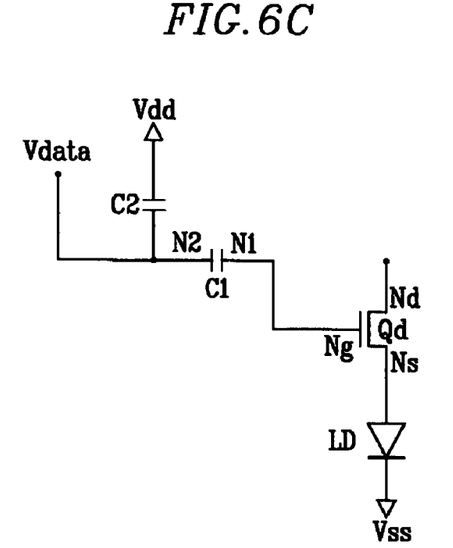

Referring to FIG. 6C, the input terminal Nd of the driving transistor Qd is opened and the terminal N2 of the capacitor C1 is connected to the data voltage Vdata. Accordingly, the control terminal voltage Vng of the driving transistor Qd is changed due to a bootstrapping effect as follows:

$$Vng=Vth+Vto+Vss+(Vdata-Vref)\times C1/(C1+C') \tag{3}$$

Here, the capacitors and the capacitances thereof are denoted as the same reference numeral and C' denotes a total parasitic capacitance formed at the control terminal Ng of the driving transistor Qd.

If the capacitance C1 is larger than the parasitic capacitance C', the control terminal voltage Vng of the driving transistor Qd is as follows:

$$Vng=Vth+Vto+Vss+Vdata-Vref \tag{4}$$

Accordingly, in this period TA3, the capacitor C1 maintains the voltage Vc given by equation 2, which is charged in the main charging period TA2, and the capacitor C1 transmits the data voltage Vdata to the control terminal Ng of the driving transistor Qd.

The capacitor C2 stabilizes the voltage of the terminal N2 of the capacitor C1 and the control terminal voltage Vng of the driving transistor Qd. Instead of the terminal N2 of the capacitor C1, one terminal of the capacitor C2 may be connected to the control terminal Ng of the driving transistor Qd. In this case, the other terminal of the capacitor C2 may be connected to the reference voltage Vref, the common voltage Vss, or another constant voltage instead of the driving voltage Vdd. At this time, equation 4 becomes:

$$Vng=Vth+Vto+Vss+(Vdata-Vref)\times C1/(C1+C2) \tag{5}$$

Here, the term including the data voltage Vdata is small and thus it may be required to adjust the magnitude of the image signals for displaying desired images.

The capacitor C2 may be omitted from FIG. 6C if it is unnecessary.

An emission period TA4 starts when the emission driver 700 changes the emission signal $Vs_i$ to the high level voltage Von to turn on the switching transistor Qs4 and the scanning driver 400 changes the scanning signal $Vg_i$ to the low level voltage Voff to turn off the switching transistor Qs1. Because the previous scanning signal $Vg_{i-1}$ maintains its low level voltage Voff in this period TA4, the switching transistors Qs2 and Qs3 are still in off states.

Figure 6D:
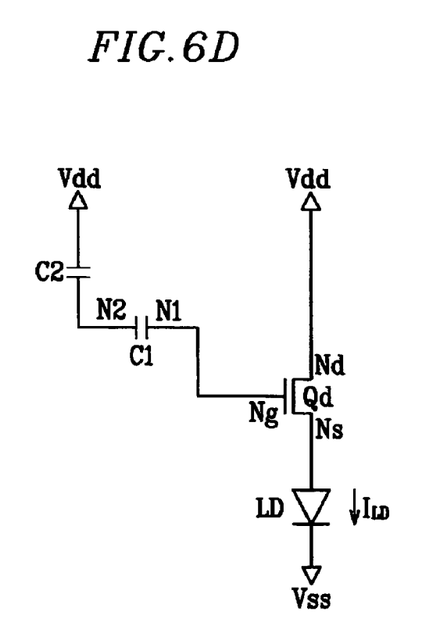

Referring to FIG. 6D, the terminal N2 of the capacitor C1 is disconnected from the data voltage Vdata and the input terminal Nd of the driving transistor Qd is connected to the driving voltage Vdd. In this state, there is no inflow and outflow of the charge carriers at the capacitor C1. Therefore, the capacitor C1 maintains its voltage Vc and thus is the control terminal voltage Vng of the driving transistor Qd.

As a result, the driving transistor Qd supplies the output current $I_{LD}$ to the light emitting element LD, which has a magnitude controlled by the voltage Vgs between the control terminal voltage Vng and the output terminal voltage Vns of the driving transistor Qd. Accordingly, the light emitting element LD emits light having an intensity depending on the magnitude of the output current $I_{LD}$, thereby displaying an image.

The output current $I_{LD}$ is expressed as follows:

$$\begin{aligned}I_{LD} &= \frac{1}{2}k(Vgs-Vth)^2 \\ &= \frac{1}{2}k(Vng-Vns-Vth)^2,\end{aligned} \tag{6}$$

Here, k is a constant depending on the characteristics of the transistor and is given by an equation k=μ·Ci·W/L, where μ denotes field effect mobility, Ci denotes a capacitance of an insulator disposed between a control terminal and a channel, W denotes the channel width, and L denotes the channel length.

Referring to equation 4 and equation 6, the output current $I_{LD}$ is affected neither by the change of the threshold voltage Vth of the driving transistor Qd nor by the change the threshold voltage Vto of the light emitting element LD. In detail, if the threshold voltage Vth of the driving transistor Qd is changed by an amount of $\Delta$Vth or the threshold voltage Vto of the driving transistor Qd is changed by an amount of $\Delta$Vto, the control terminal Ng of the driving transistor Qd is charged with the voltage Vng reflecting the voltage variations $\Delta$Vth and $\Delta$Vto in the main charging period TA2. Accordingly, the voltage variations $\Delta$Vth and $\Delta$Vto are included in each of the voltages Vng and Vth or Vng and Vns in equation 6 such that they are cancelled.

As a result, the OLED according to an exemplary embodiment of the present invention compensates for the change of the threshold voltage Vth of the driving transistor Qd and the threshold voltage Vto of the light emitting element LD.

In addition, the emission signal $Vs_i$ may go to the high level voltage Von in advance in the writing period TA3. In this case, it is preferable that the switching transistor Qs4 turns on after the switching transistor Qs3 turns off.

The emission period TA4 continues until the precharging period TA1 for the corresponding pixels starts in the next frame. The operation of the OLED in the periods TA1-TA4 repeats for the next group of pixels. In this way, the operations in the periods TA1-TA4 are performed for all the pixels to display images. It is noted that the scanning line $G_0$ and the scanning signal $Vg_0$ are required for the first pixel row to display images. In addition, the length of the periods TA1-TA4 may be adjusted.

The reference voltage Vref may be equal to the common voltage Vss, for example, equal to 0V. Otherwise, the reference voltage Vref may have a negative voltage level. In this case, the data voltages Vdata supplied from the data driver 500 can be reduced. The reference voltage Vref is adjusted based on the characteristics of the display panel 300 and in this case the luminance of the display panel 300 is changed.

In particular, the driving voltage Vdd may vary along rows or columns due to the resistance of the driving voltage lines as the display panel 300 increases in size. In this case, the reference voltage Vref may also be varied along rows or columns to make the luminance of the display panel 300 uniform.

The driving voltage Vdd preferably has a magnitude sufficient for supplying charge carriers to the capacitor Cst and for making the driving transistor Qd generate the output current $I_{LD}$.

Now, an OLED according to another exemplary embodiment of the present invention will be described in detail with reference to FIGS. 7 and 8.

Figure 7:
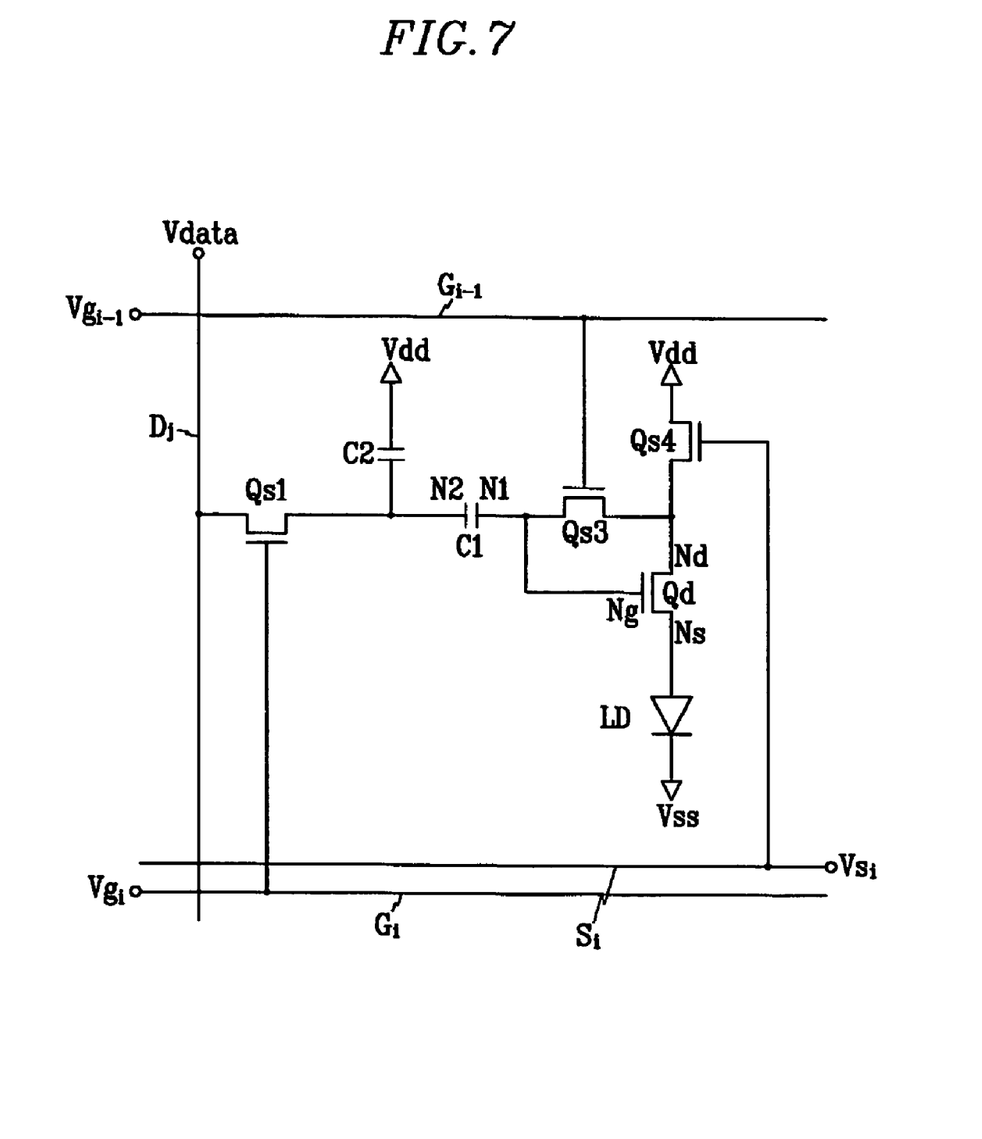
FIG. 7 is an equivalent circuit diagram of a pixel of an OLED according to another exemplary embodiment of the present invention.

FIG. 7 is an equivalent circuit diagram of a pixel of an OLED according to another exemplary embodiment of the present invention.

Referring to FIG. 7, the pixel of the OLED, for example, a pixel connected to a scanning line $G_i$ and a data line $D_j$ includes an organic light emitting element LD, a driving transistor Qd, a pair of capacitors C1 and C2, and three switching transistors Qs1, Qs3 and Qs4.

The configuration of the pixel shown in FIG. 7 is equivalent to that shown in FIG. 2 without the switching transistor Qs2 thus a detailed description thereof will be omitted.

The operation of the above-described OLED will be described in detail with reference to FIG. 8.

Figure 8:
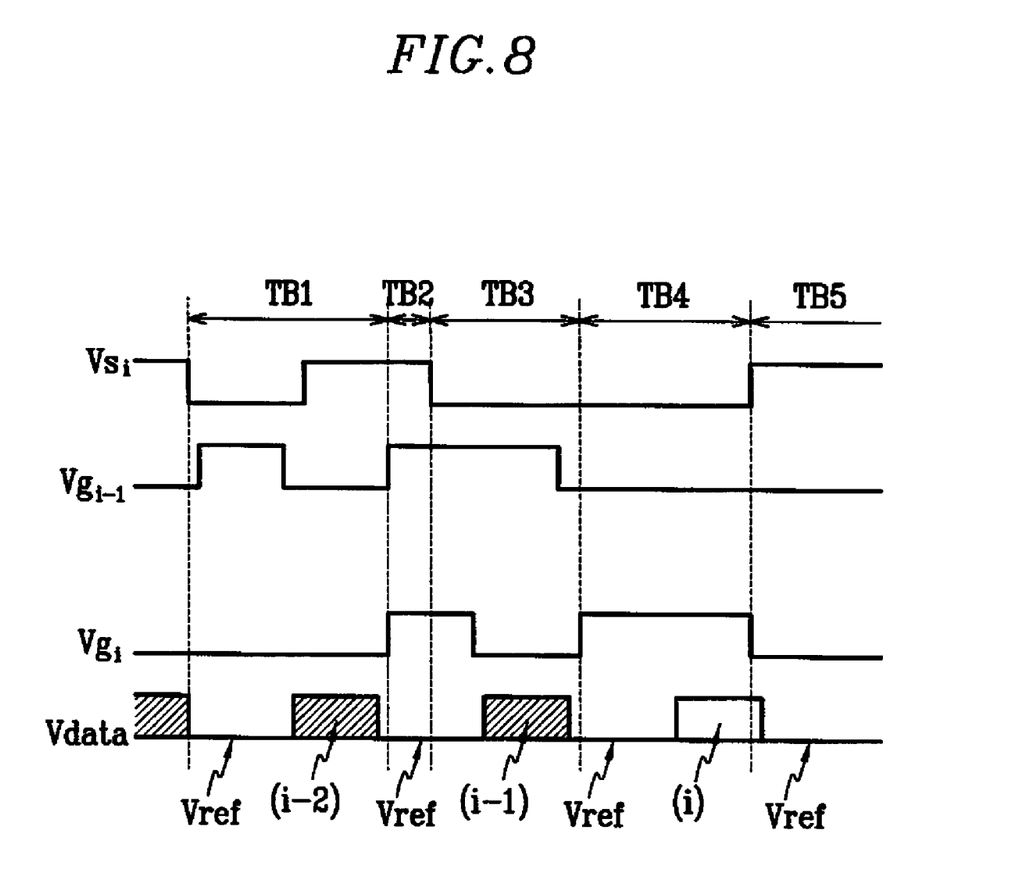
FIG. 8 is a timing chart illustrating several signals for the OLED shown in FIG. 7.

FIG. 8 is a timing chart illustrating several signals for an OLED shown in FIG. 7. An i-th pixel row of the OLED shown in FIG. 7 will be discussed.

Referring to FIG. 8, a preliminary period TB1 starts when the emission driver 700 changes the emission signal $Vs_i$ to the low level voltage Voff to turn off the switching transistor Qs4 connected to the emission signal line $S_i$ in response to the emission control signals CONT3 from the signal controller 600.

Because the scanning signal $Vg_i$ maintains the low level voltage Voff in this period TB1, the switching transistor Qs1 connected to the scanning line $G_i$ maintains its off state.

In response to the scanning control signals CONT1 from the signal controller 600, the scanning driver 400 changes the previous scanning signal $Vg_{i-1}$ to the high level voltage Von, and after a predetermined time elapses, the scanning driver 400 changes the previous scanning signal $Vg_{i-1}$ to the low level voltage Voff.

After the previous scanning signal $Vg_{i-1}$ goes to the low level voltage Voff, the emission driver 700 changes the emission signal $Vs_i$ to the high level voltage Von to turn on the switching transistor Qs4.

The previous scanning signal $Vg_{i-1}$ and the data voltage Vdata in this period TB1 are used for displaying images on the (i−1)-th pixel row and the (i−2)-th pixel row. Therefore, the period TB1 is prepared not for the display of the i-th pixel row but for removing the affect of the previous scanning signal $Vg_{i-1}$ and the data voltage Vdata on the i-th pixel row. In detail, although the previous scanning signal $Vg_{i-1}$ is changed to the high level voltage Von to turn on the switching transistor Qs3, the driving transistor Qd is disconnected from the driving voltage Vdd because the switching transistor Qs4 is in the off state. In addition, because the switching transistor Qs1 is in the off state, the reference voltage Vref and the data voltage Vdata for the (i−2)-th pixel row are not transmitted to the capacitor C1. Therefore, the control terminal voltage Vng of the driving transistor Qd is not changed such that the display of the i-th pixel row is not affected.

The data driver 500 applies the reference voltage Vref to the data lines $D_1$-$D_m$ at a time when the preliminary period TB1 finishes. Thereafter, the scanning driver 400 changes the previous scanning signal $Vg_{i-1}$ and the scanning signal $Vg_i$ to the high level voltage Von to turn on the switching transistors Qs1 and Qs3, thereby starting a precharging period TB2.

Because the emission signal $Vs_i$ maintains the high level voltage Von, the switching transistor Qs4 remains in the on state. Alternatively, the switching transistor Qs4 may be turned on at the beginning of the precharging period TB2 not in the preliminary period TB1.

Except for the switching transistor Qs1 turning on to apply the reference voltage Vref to the terminal N2 of the capacitor C1 through the data lines $D_i$-$D_m$, the operation of the precharging period TB2 is almost the same as that in the precharging period TA1 shown in FIG. 5 thus a detailed description thereof will be omitted.

A main charging period TB3 begins when the emission driver 700 changes the emission signal $Vs_i$ to the low level voltage Voff again to turn off the switching transistor Qs4. Because the previous scanning signal $Vg_{i-1}$ and the scanning signal $Vg_i$ maintain the high level voltage Von in this period TB3, the switching transistors Qs1 and Qs3 remain in their on states.

Therefore, the capacitor C1 charges the voltage Vc given by equation 2. The charging of the voltage Vc in this period TB3 is almost the same as that in the main charging period TA2 thus a detailed description thereof will be omitted.

After a predetermined time elapses, the scanning driver 400 changes the scanning signal $Vg_i$ to the low level voltage Voff to turn off the switching transistor Qs1. Then, the i-th pixel row is not affected by the application of the data voltage Vdata for the (i−1)-th pixel row.

After a predetermined time elapses again, the scanning driver 400 varies the previous scanning signal $Vg_{i-1}$ to the low level voltage Voff and the data driver 500 applies the reference voltage Vref to the data lines $D_1$-$D_m$.

Next, the scanning driver 400 changes the scanning signal $Vg_i$ to the high level voltage Von to turn on the switching transistor Qs1, thereby starting the writing period TB4.

Because the previous scanning signal $Vg_{i-1}$ and the emission signal $Vs_i$ maintain the low level voltage Voff in this period TB4 the switching transistors Qs3 and Qs4 remain in the off state.

At the beginning of the writing period TB4, the terminal N2 of the capacitor C1 is supplied with the reference voltage Vref. The reference voltage Vref is supplied for the display of the next, (i+1)th pixel row, and it does not affect the voltage Vc stored in the capacitor C1 and the control terminal voltage Vng.

After a predetermined time elapses, the data driver 500 applies the data voltage Vdata for the i-th pixel row to the data lines $D_1$-$D_m$. Therefore, the capacitor C1 transmits the data voltage Vdata to the control terminal Ng of the driving transistor Qd and maintains the voltage Vng given by equation 4.

The writing of the data voltage Vdata is almost the same as the writing period TA3 shown in FIG. 5 thus a detailed description thereof will be omitted.

An emission period begins when the emission driver 700 changes the emission signal $Vs_i$ to the high level voltage Von to turn on the switching transistor Qs4 and the scanning driver 400 changes the scanning signal $Vg_i$ to the low level voltage Voff to turn off the switching transistor Qs1. Because the previous scanning signal $Vg_{i-1}$ maintains the low level voltage Voff in this period TB5, the switching transistor Qs3 maintains its off state.

The display operation in this period TB5 is almost the same as the emission period TA4 shown in FIG. 5 thus a detailed description thereof will be omitted.

As a result, the control terminal voltage Vng of the driving transistor Qd satisfies equation 4 during the emission period TB5, and thus the OLED according to this embodiment compensates for the change of the threshold voltage Vth of the driving transistor Qd and the threshold voltage Vto of the light emitting element LD.

In addition, the OLED according to this embodiment applies the reference voltage Vref through the data driver 500 to reduce the number of the switching transistors and the signal lines. Furthermore, the applied reference voltage Vref can have different magnitudes depending on the position, thereby adjusting the luminance of the display panel 300 to be uniform.

Although exemplary embodiments of the present invention have been described in detail hereinabove, it should be understood that many variations and/or modifications of the inventive concepts herein taught, which may appear to those skilled in the art, will fall within the spirit and scope of the present invention as defined in the appended claims.

What is claimed is:

1. A display device comprising a plurality of pixels, each pixel including:
   a light emitting element;
   a storage capacitor;
   a driving transistor that has a control terminal, an input terminal, and an output terminal and supplies a current to the light emitting element to emit light;
   a first switching transistor supplying a data voltage to the storage capacitor in response to a scanning signal;
   a second switching transistor diode-connecting the driving transistor in response to a previous scanning signal, wherein an input terminal of the second switching transistor is directly connected to the control terminal of the driving transistor;
   a third switching transistor supplying a driving voltage to the driving transistor in response to an emission signal; and
   a fourth switching transistor connecting the storage capacitor to a reference voltage in response to the previous scanning signal,
   wherein the storage capacitor stores a control voltage depending on a threshold voltage of the driving transistor and a threshold voltage of the light emitting element through the diode-connected driving transistor, and transmits the control voltage and the data voltage to the control terminal of the driving transistor,
   wherein an output terminal of the third switching transistor is directly connected to the input terminal of the driving transistor, and the third switching transistor and the driving transistor are transistors of the same type, and
   wherein a first terminal of the storage capacitor is directly connected to an output terminal of the first switching transistor, and a second terminal of the storage capacitor is directly connected to the control terminal of the driving transistor.

2. The display device of claim 1, wherein the second switching transistor connects the control terminal and the input terminal of the driving transistor in response to the previous scanning signal.

3. The display device of claim 2, wherein the first switching transistor connects the storage capacitor to the data voltage in response to the scanning signal and the third switching transistor connects the input terminal of the driving transistor to the driving voltage in response to the emission signal.

4. The display device of claim 1, wherein the plurality of pixels comprises first and second pixels supplied with different values of the reference voltage.

5. The display device of claim 1, further comprising:
   an auxiliary capacitor connected to the storage capacitor and storing a voltage, wherein a first terminal of the auxiliary capacitor is directly connected to an input terminal of the fourth switching transistor.

6. The display device of claim 3, further comprising:
   a scanning driver generating the previous scanning signal and the scanning signal;
   a data driver generating the data voltage; and
   an emission driver generating the emission signal.

7. The display device of claim 3, wherein the first switching transistor connects the storage capacitor to a reference voltage in response to the scanning signal.

8. The display device of claim 7, further comprising:
   a scanning driver generating the previous scanning signal and the scanning signal;
   a data driver generating the data voltage and the reference voltage; and
   an emission driver generating the emission signal.

9. The display device of claim 8, wherein the plurality of pixels comprises first and second pixels and the reference voltage has different values to be supplied to the first and the second pixels.

10. The display device of claim 8, further comprising:
    a signal controller controlling the scanning driver, the data driver, and the emission driver.

11. The display device of claim 3, wherein the first, second and third switching transistors and the driving transistor comprise amorphous silicon.

12. The display device of claim 3, wherein the first, second and third switching transistors and the driving transistor comprise n-channel thin film transistors.

13. The display device of claim 3, wherein the light emitting element comprises an organic light emitting layer.

14. A display device comprising:
    a light emitting element;
    a driving transistor having an input terminal connected to a driving voltage, an output terminal connected to the light emitting element, and a control terminal;
    a first switching transistor that is connected between the control terminal of the driving transistor and a data voltage and operates in response to a scanning signal;
    a second switching transistor connected between the input terminal and the control terminal of the driving transistor and operates in response to a previous scanning signal, wherein an input terminal of the second switching transistor is directly connected to the control terminal of the driving transistor;
    a third switching transistor connected between the input terminal of the driving transistor and the driving voltage and operates in response to an emission signal;
    a storage capacitor connected between the control terminal of the driving transistor and the first switching transistor; and
    a fourth switching transistor operating in response to the previous scanning signal and connected between the storage capacitor and a reference voltage,
    wherein an output terminal of the third switching transistor is directly connected to the input terminal of the driving transistor, and the third switching transistor and the driving transistor are transistors of the same type, and
    wherein a first terminal of the storage capacitor is directly connected to an output terminal of the first switching transistor, and a second terminal of the storage capacitor is directly connected to the control terminal of the driving transistor.

15. The display device of claim 14, further comprising:
    an auxiliary capacitor connected between the storage capacitor and one of the driving voltage and the reference voltage, wherein a first terminal of the auxiliary capacitor is directly connected to an input terminal of the fourth switching transistor.

16. A method of driving a display device including a driving transistor having a control terminal and first and second terminals, a first switching transistor having an output terminal that is directly connected to the first terminal of the driving transistor, wherein the first switching transistor and the driving transistor are transistors of the same type, a light emitting element connected to the second terminal of the driving transistor, a capacitor connected to the control terminal of the driving transistor, a second switching transistor diode-connecting the driving transistor in response to a previous scanning signal, wherein an input terminal of the second switching transistor is directly connected to the control terminal of the driving transistor, and a third switching transistor operating in response to the previous scanning signal and connected between the storage capacitor and a reference voltage, the method comprising:

supplying a reference voltage and a driving voltage to the capacitor;

connecting the control terminal and the first terminal of the driving transistor;

applying a data voltage to the capacitor; and connecting the first terminal of the driving transistor to the driving voltage, wherein the driving voltage is transmitted through the first switching transistor to the capacitor, wherein the first switching transistor supplies the driving voltage to the driving transistor in response to an emission signal, and wherein a first terminal of the storage capacitor is directly connected to an output terminal of the first switching transistor, and a second terminal of the storage capacitor is directly connected to the control terminal of the driving transistor.

17. The method of claim 16, wherein the connection of the control terminal and the first terminal of the driving transistor blocks the driving voltage.

18. The method of claim 16, wherein the application of the data voltage isolates the first terminal of the driving transistor.

* * * * *